(12) United States Patent
Gwon et al.

(10) Patent No.: US 11,188,162 B2
(45) Date of Patent: Nov. 30, 2021

(54) DISPLAY APPARATUS HAVING A TOUCH ELECTRODE ON AN ENCAPSULATING ELEMENT

(71) Applicant: LG Display Co., Ltd., Seoul (KR)

(72) Inventors: Hyang-Myoung Gwon, Paju-si (KR); Ji-Hyun Jung, Paju-si (KR); Su-Chang An, Seoul (KR); Jae-Gyun Lee, Paju-si (KR); Ru-Da Rhe, Seoul (KR); Jeong-Hoon Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/908,294

(22) Filed: Jun. 22, 2020

(65) Prior Publication Data
US 2020/0409485 A1 Dec. 31, 2020

(30) Foreign Application Priority Data
Jun. 28, 2019 (KR) .......................... 10-2019-0078111

(51) Int. Cl.
*G06F 3/041* (2006.01)
*H01L 51/52* (2006.01)
*H01L 27/32* (2006.01)

(52) U.S. Cl.
CPC ............ *G06F 3/041* (2013.01); *H01L 27/323* (2013.01); *H01L 27/3244* (2013.01); *H01L 51/5253* (2013.01)

(58) Field of Classification Search
CPC combination set(s) only.
See application file for complete search history.

(56) References Cited

U.S. PATENT DOCUMENTS

| | | | |
|---|---|---|---|
| 2009/0058294 A1* | 3/2009 | Joo ....................... | H01L 51/525 313/512 |
| 2016/0349895 A1* | 12/2016 | Long ....................... | G06F 3/044 |
| 2018/0033831 A1* | 2/2018 | An ....................... | G06F 3/04164 |
| 2018/0095570 A1* | 4/2018 | Hong ................... | H01L 51/5284 |

* cited by examiner

*Primary Examiner* — Temesghen Ghebretinsae
*Assistant Examiner* — Sosina Abebe
(74) *Attorney, Agent, or Firm* — Fenwick & West LLP (57) ABSTRACT

A display apparatus is provided. In the display apparatus, a touch electrode may be disposed on the encapsulating element covering a light-emitting device, and a touch pad may be disposed on the outside of the encapsulating element. A touch line may be connected to the touch electrode. The touch line may be connected to the touch pad by a first touch link and a second touch link. The first touch link may include a first end connected to the second touch link, and a second end connected to the touch line. The first end of the first touch link may overlap with the encapsulating element. Thus, in the display apparatus, the reliability for a touch of a user or a tool may be improved.

13 Claims, 4 Drawing Sheets

DISPLAY APPARATUS HAVING A TOUCH ELECTRODE ON AN ENCAPSULATING ELEMENT

CROSS-REFERENCE TO RELATED APPLICATIONS

This application claims the priority benefit of Republic of Korea Patent Application No. 10-2019-0078111, filed on Jun. 28, 2019, which is hereby incorporated by reference as if fully set forth herein.

BACKGROUND

Field

The present disclosure relates to a display apparatus in which a touch electrode is disposed on an encapsulating element covering a light-emitting device.

Discussion of the Related Art

Generally, an electronic appliance, such as a monitor, a TV, a laptop computer and a digital camera, includes a display apparatus to realize an image. For example, the display apparatus may include light-emitting devices. Each of the light-emitting devices may emit light displaying a specific color. For example, each of the light-emitting devices may include a light-emitting layer between a first electrode and a second electrode.

The display apparatus may run a certain program or input a specific signal by touch of a user or tool. For example, the display apparatus may include touch electrodes on an encapsulating element which covers the light-emitting devices. Each of the touch electrodes may be connected to a corresponding touch pad by one of touch lines. The touch lines may be disposed on the same layer as the touch electrodes. For example, the display apparatus may include a self-capacitance type touch structure.

However, in the display apparatus, the area in which the touch of the user or tool is not recognized may be increased by the touch lines. For example, in the display apparatus, a space between the touch electrodes may be increased. Thus, in the display apparatus, the reliability for the touch of the user or tool may be deteriorated.

SUMMARY

Accordingly, the present disclosure is directed to a display apparatus that substantially obviates one or more problems due to limitations and disadvantages of the related art.

An object of the present disclosure is to provide a display apparatus capable of improving the reliability for the touch of the user or tool.

Another object of the present disclosure is to provide a display apparatus capable of reducing a space between the touch electrodes disposed on the same layer as the touch lines.

Additional advantages, objects, and features of the disclosure will be set forth in part in the description which follows and in part will become apparent to those having ordinary skill in the art upon examination of the following or may be learned from practice of the disclosure. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, there is provided a display apparatus comprising a device substrate. A light-emitting device is disposed on a display area of the display substrate. The light-emitting device is covered by an encapsulating element. The encapsulating element extends beyond the display area. A touch electrode and a touch line are disposed on the encapsulating element. The touch line is disposed on the same layer as the touch electrode. The touch line is connected to the touch electrode. The touch line extends in the outer direction of the display area. A touch pad spaced away from the encapsulating element is disposed on the device substrate. A first touch link includes a first end in the display area, and a second end at the outside of the display area. The first end of the first touch link is connected to the touch pad by a second touch link. The second end of the first touch link is connected to the touch line.

The touch line may include the same material as the touch electrode.

An over-coat layer may be disposed between the device substrate and the light-emitting device. The first touch link and the second touch link may include a portion between the device substrate and the over-coat layer, respectively.

The first end of the first touch link may be disposed between the device substrate and the second touch link.

A thin film transistor may be disposed between the device substrate and the over-coat layer. The thin film transistor may include a gate insulating layer on a semiconductor pattern, a gate electrode on the gate insulating layer, a first interlayer insulating layer on the gate electrode, a second interlayer insulating layer on the first interlayer insulating layer, a source electrode on the second interlayer insulating layer, and a drain electrode spaced away from the source electrode. The second touch link may be disposed on the second interlayer insulating layer.

The second touch link may include the same material as the source electrode and the drain electrode.

The first touch link may be disposed between the first interlayer insulating layer and the second interlayer insulating layer.

The encapsulating element may include a touch contact hole exposing the second end of the first touch link.

In another embodiment, the display apparatus includes an encapsulating element on a device substrate. A touch electrode is disposed on the encapsulating element. The touch electrode is connected to a touch line extending in a first direction. A first touch link includes a first end overlapping with the encapsulating element, and a second end connected to the touch line. The first touch link extends in the first direction. A second touch link is connected to the first end of the first touch link. The second touch link extends in a second direction perpendicular to the first direction.

The second end of the first touch link may be disposed outside the encapsulating element.

The touch line may include the same material as the touch electrode. The first touch link and the second touch link may include a portion disposed between the device substrate and the encapsulating element.

The second touch link may include a material different from the first touch link.

The first end of the first touch link may overlap the touch electrode.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
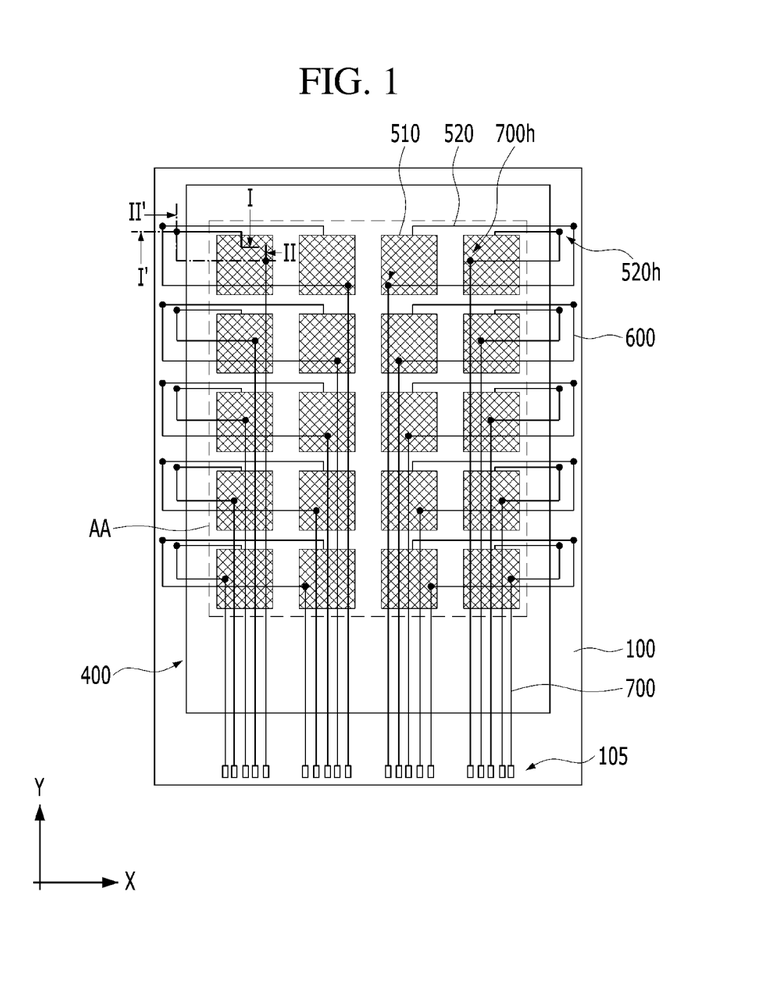
FIG. 1 is a view schematically showing a display apparatus according to an embodiment of the present disclosure.
Figure 2A:
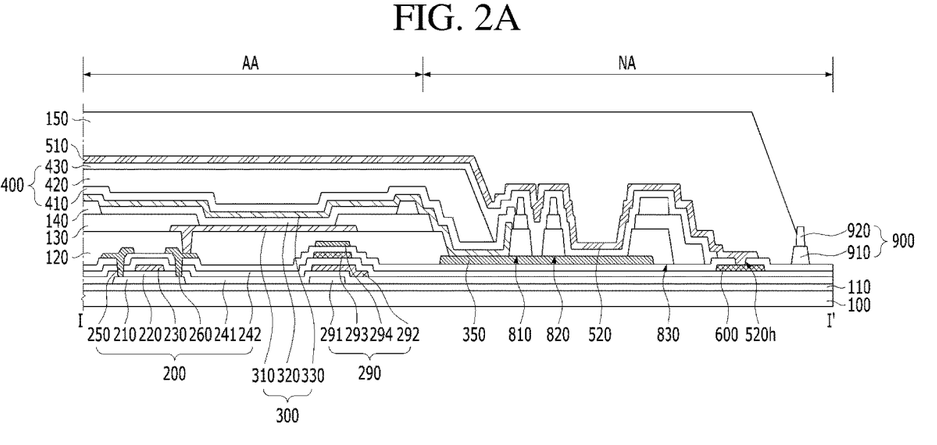
FIG. 2A is a view taken along I-I' of FIG. 1 according to an embodiment of the present disclosure.
Figure 2B:
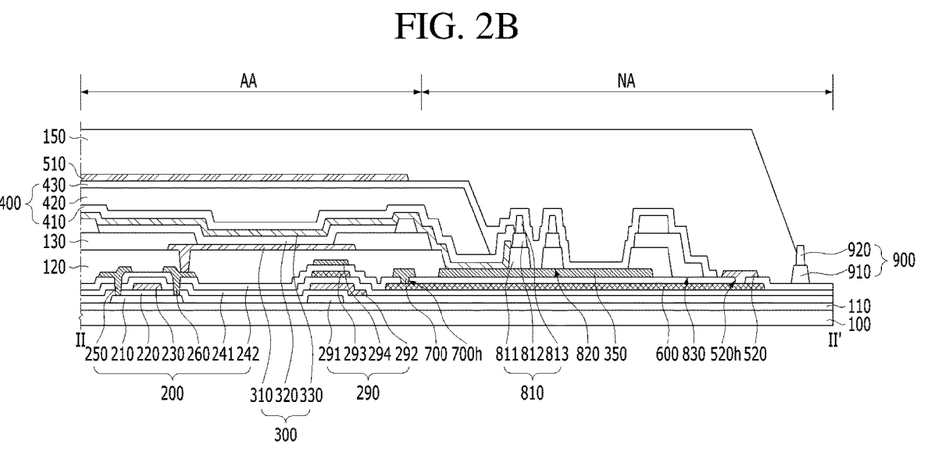
FIG. 2B is a view taken along II-II' of FIG. 1 according to an embodiment of the present disclosure.

FIG. 1 is a view schematically showing a display apparatus according to an embodiment of the present disclosure. FIG. 2A is a view taken along I-I' of FIG. 1 according to an embodiment of the present disclosure. FIG. 2B is a view taken along II-II' of FIG. 1 according to an embodiment of the present disclosure.

Referring to FIGS. 1, 2A and 2B, the display apparatus according to the embodiment of the present disclosure may include a device substrate 100. The device substrate 100 may include an insulating material. For example, the device substrate 100 may include glass or plastic.

The device substrate 100 may include a display area AA and a bezel area NA. The bezel area NA may be disposed outside the display area AA. For example, the display area may be surrounded by the bezel area NA.

A plurality of light-emitting devices 300 may be disposed on the display area AA of the device substrate 100. Each of the light-emitting devices 300 may emit light displaying a specific color. For example, each of the light-emitting devices 300 may include a first electrode 310, a light-emitting layer 320, and a second electrode 330, which are sequentially stacked.

The first electrode 310 may include a conductive material. The first electrode 310 may include a metal having relative high reflectance. The first electrode 310 may have a multi-layer structure. For example, the first electrode 310 may have a structure in which a reflective electrode formed of a metal such as aluminum (Al) and silver (Ag) is disposed between transparent electrodes formed of transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present invention is an organic light-emitting display apparatus having the light-emitting layer 320 formed of an organic material.

The light-emitting layer 320 may have a multi-layer structure in order to increase luminous efficiency. For example, the light-emitting layer 320 may further include at least one of a hole injection layer (HIL), a hole transporting layer (HTL), an electron transporting layer (ETL), and an electron injection layer (EIL).

The second electrode 330 may include a conductive material. The second electrode 330 may include a material different from the first electrode 310. For example, the second electrode 330 may be a transparent electrode formed of a transparent conductive material, such as ITO and IZO. Thus, in the display apparatus according to the embodiment of the present disclosure, the light generated from the light-emitting layer 320 may be emitted to outside through the second electrode 330.

The light-emitting devices 300 may be independently driven. For example, an edge of the first electrode 310 of each light-emitting device 300 may be covered by a bank insulating layer 130. The bank insulating layer 130 may include an insulating material. For example, the bank insulating layer 130 may include an organic insulating material. The light-emitting layer 320 and the second electrode 330 of each light-emitting device 300 may be stacked on a portion of the corresponding first electrode 310 exposed by the bank insulating layer 130.

The light-emitting layer 320 of each light-emitting device 300 may be separated from the light-emitting layer 320 of an adjacent light-emitting device 300. For example, the light-emitting layer 320 of each light-emitting device 300 may be formed using a fine metal mask (FMM). A spacer 140 may be disposed on the bank insulating layer 130. The spacer 140 may prevent the damage of the bank insulating layer 130 due to the fine metal mask. The spacer 140 may include an insulating material.

The second electrode 330 of each light-emitting device 300 may extend onto the bank insulating layer 130. For example, the second electrode 330 of each light-emitting device 300 may be connected to the second electrode 330 of an adjacent light-emitting device 300. The second electrode 330 may extend onto the bezel area NA of the device substrate 100. For example, a side surface of the bank insulating layer 130 disposed closest to the bezel area NA may be covered by the second electrode 330. Thus, in the display apparatus according to the embodiment of the present disclosure, the permeation of external moisture through the bank insulating layer 130 may be prevented.

A driving circuit may be disposed between the device substrate 100 and each light-emitting device 300. The driving circuit may supply driving current according to a gate signal and a data signal to the corresponding light-emitting device 300. For example, the driving circuit may include at least one thin film transistor 200 and a storage capacitor 290. Thus, in the display apparatus according to the embodiment of the present disclosure, the operation of each light-emitting device 300 may be independently controlled.

The thin film transistor 200 may generate the driving current according to the gate signal and the data signal. For example, the thin film transistor 200 may include a semiconductor pattern 210, a gate insulating layer 220, a gate electrode 230, a first interlayer insulating layer 241, a second interlayer insulating layer 242, a source electrode 250 and a drain electrode 260. The first electrode 310 of each light-emitting device 300 may be electrically connected to the drain electrode 260 of the corresponding thin film transistor 200.

The semiconductor pattern 210 may be disposed close to the device substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The channel region may have conductivity lower than the source region and the drain region. For example, the source region and the drain region may have an impurity concentration higher than the channel region.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may have a multi-layer structure. The gate insulating layer 220 may include a high-K material. For example, the gate insulating layer 220 may include hafnium oxide (HfO) or titanium oxide (TiO).

The gate electrode 230 may be disposed on the gate insulating layer 220. The gate electrode 230 may overlap the channel region of the semiconductor pattern 210. The gate electrode 230 may be insulated from the semiconductor pattern 210 by the gate insulating layer 220. The gate electrode 230 may include a conductive material. For example, the gate electrode 230 may include a metal, such as aluminum (Al), chrome (Cr), copper (Cu), Titanium (Ti), molybdenum (Mo) and tungsten (W). The gate electrode 230 may have a multi-layer structure.

The first interlayer insulating layer 241 and the second interlayer insulating layer 242 may be sequentially stacked on the gate insulating layer 220 and the gate electrode 230. The first interlayer insulating layer 241 and the second interlayer insulating layer 242 may include an insulating material. For example, the first interlayer insulating layer 241 and the second interlayer insulating layer 242 may include silicon oxide or silicon nitride. The second interlayer insulating layer 242 may include the same material as the first interlayer insulating layer 241. For example, a boundary between the first interlayer insulating layer 241 and the second interlayer insulating layer 242 may not be clearly distinguished.

The source electrode 250 and the drain electrode 260 may be disposed on the second interlayer insulating layer 242. The source electrode 250 may be electrically connected to the source region of the semiconductor pattern 210. The drain electrode 260 may be electrically connected to the drain region of the semiconductor pattern 210. The drain electrode 260 may be spaced away from the source electrode 250. For example, the first interlayer insulating layer 241 and the second interlayer insulating layer 242 may include a source contact hole exposing the source region of the semiconductor pattern 210, and a drain contact hole exposing the drain region of the semiconductor pattern 210.

The source electrode 250 and the drain electrode 260 may include a conductive material. For example, the source electrode 250 and the drain electrode 260 may include a metal, such as aluminum (Al), chrome (Cr), copper (Cu), Titanium (Ti), molybdenum (Mo) and tungsten (W). The drain electrode 260 may include the same material as the source electrode 250. The source electrode 250 may have a multi-layer structure. The drain electrode 260 may have the same structure as the source electrode 250. For example, the drain electrode 260 may have a multi-layer structure.

The storage capacitor 290 may include at least two conductive layers. For example, the storage capacitor 290 may include a first storage electrode 291, a second storage electrode 292, a third storage electrode 293, and a fourth storage electrode 294, which are sequentially stacked.

The first storage electrode 291 may be disposed on the same layer as the semiconductor pattern 210. For example, the first storage electrode 291 may be disposed between the device substrate 100 and the gate insulating layer 220. The first storage electrode 291 may include the same material as the semiconductor pattern 210. The second storage electrode 292 may be disposed on the same layer as the gate electrode 230. For example, the second storage electrode 292 may be disposed between the gate insulating layer 220 and the first interlayer insulating layer 241. The second storage electrode 292 may include the same material as the gate electrode 230. The third storage electrode 293 may be disposed between the first interlayer insulating layer 241 and the second interlayer insulating layer 242. The fourth storage electrode 294 may be disposed on the same layer as the source electrode 250 and the drain electrode 260. For example, the fourth storage electrode 294 may be disposed on the second interlayer insulating layer 242. The fourth storage electrode 294 may include the same material as the source electrode 250 and the drain electrode 260. For example, the storage capacitor 290 may be formed simultaneously with the thin film transistor 200. The third storage electrode 293 may include a material different from the fourth storage electrode 294.

A buffer layer 110 may be disposed between the device substrate 100 and each driving circuit. The buffer layer 110 may prevent pollution from the device substrate 100 during the process of forming the driving circuits. The buffer layer 110 may include an insulating material. For example, the buffer layer 110 may include silicon oxide and/or silicon nitride. The buffer layer 110 may have a multi-layer structure. The buffer layer 110 may extend along a surface of the device substrate 100. For example, the buffer layer 110 may extend onto the bezel area NA of the device substrate 100.

An over-coat layer 120 may be disposed between the driving circuits and the light-emitting devices 300. The over-coat layer 120 may remove a thickness difference due to the driving circuits. For example, a surface of the over-coat layer 120 opposite to the device substrate 100 may be a flat surface. The thin film transistor 200 and the storage capacitor 290 of each driving circuit may be covered by the over-coat layer 120, completely. The over-coat layer 120 may include an insulating material. For example, the over-coat layer 120 may include an organic insulating material.

The over-coat layer 120 may include a side surface toward the bezel area NA. The second electrode 330 may extend onto the side surface of the over-coat layer 120. For example, the side surface of the over-coat layer 120 may be covered by the second electrode 330. Thus, in the display apparatus according to the embodiment of the present disclosure, the permeation of the external moisture through the over-coat layer 120 may be prevented.

A common voltage supply line 350 may be disposed on the bezel area NA of the device substrate 100. The common voltage supply line 350 may be connected to the second electrode 330. For example, the common voltage supply line 350 may include a portion disposed outside the over-coat layer 120. The over-coat layer 120 may cover an end of the common voltage supply line 350.

The common voltage supply line 350 may be disposed on the same layer as the source electrode 250 and the drain electrode 260. For example, the gate insulating layer 220, the first interlayer insulating layer 241 and the second interlayer insulating layer 242 may extend onto the bezel area NA of the device substrate 100. The common voltage supply line 350 may be disposed on the second interlayer insulating layer 242. The common voltage supply line 350 may include a conductive material. For example, the common voltage supply line 350 may include the same material as the source electrode 250 and the drain electrode 260.

At least one dam 810, 820, and 830 may be disposed on the common voltage supply line 350. For example, a first dam 810, a second dam 820, and a third dam 830 may be disposed side by side on the common voltage supply line 350. The third dam 830 spaced farthest from the side surface of the over-coat layer 120 may cover the other end of the common voltage supply line 350. The first dam 810 and the second dam 820 may be disposed between the over-coat layer 120 and the third dam 830. The second electrode 330 may be in contact with the common voltage supply line 350 between the over-coat layer 120 and the first dam 810.

The dam 810, 820, and 830 may be formed using a process of forming the over-coat layer 120, the bank insulating layer 130, and the spacer 140. For example, the first dam 810 may have a stacked structure of a first layer 811 including the same material as the over-coat layer 120, a second layer 812 including the same material as the bank insulating layer 130, and a third layer 813 including the same material as the spacer 140. The second dam 820 and the third dam 830 may have the same structure as the first dam 810. For example, the second dam 820 and the third dam 830 may have a triple layer structure.

An encapsulating element 400 may be disposed on the light-emitting devices 300. The encapsulating element 400 may prevent the damage of the light-emitting devices 300 due to the external impact and moisture. The encapsulating element 400 may have a multi-layer structure. For example, the encapsulating element 400 may include a first encapsulating layer 410, a second encapsulating layer 420, and a third encapsulating layer 430, which are sequentially stacked.

The first encapsulating layer 410, the second encapsulating layer 420, and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may be an inorganic insulating layer formed of an inorganic insulating material, and the second encapsulating layer 420 may be an organic insulating layer formed of an organic insulating material.

The encapsulating element 400 may extend beyond the display area AA. For example, the third encapsulating layer 430 may extend onto the third dam 830. The extension of the first encapsulating layer 810 and the second encapsulating layer 820 may be blocked by the first dam 810. For example, the display apparatus according to the embodiment of the present disclosure may control the flow of the second encapsulating layer 420 formed of an organic material by the first dam 810, the second dam 820, and the third dam 830.

Touch electrodes 510 and touch lines 520 may be disposed on the encapsulating element 400. The touch electrodes 510 and the touch lines 520 may detect the touch of a user or tool. For example, the touch electrodes 510 may be arranged in a matrix form in the display area AA. The touch electrodes 510 may include a conductive material. The touch electrodes 510 may overlap at least one of the light-emitting devices 300. The touch electrodes 510 may include a transparent material. For example, the touch electrodes 510 may be a transparent electrode formed of a transparent conductive material, such as ITO and IZO.

Each of the touch lines 520 may be connected to one of the touch electrodes 510. The touch lines 520 may be disposed on the same layer as the touch electrodes 510. For example, the touch electrodes 510 and the touch lines 520 may be in direct contact with the encapsulating element 400. The touch lines 520 may include the same material as the touch electrodes 510. For example, each of the touch lines 520 may be formed simultaneously with the corresponding touch electrode 510.

Each of the touch lines 520 may extend onto the bezel area NA of the device substrate 100. The touch lines 520 may extend in a first direction X. For example, each of the touch lines 520 may include an end disposed in the bezel area NA. The end of each touch line 520 may be disposed outside the encapsulating element 400. For example, each of the touch lines 520 may extend along a surface of the third dam 830.

A first touch links 600 may be disposed between the first interlayer insulating layer 241 and the second interlayer insulating layer 242. The first touch links 600 may include a conductive material. For example, the first touch links 600 may include the same material as the third storage electrode 293.

The first touch links 600 may extend in the first direction X. The first touch links 600 may cross a boundary between the display area AA and the bezel area NA of the device substrate 100. For example, each of the first touch links 600 may include a first end disposed in the display area AA of the device substrate 100, and a second end disposed in the bezel area NA of the device substrate 100. The first end of each first touch link 600 may overlap the encapsulating element 400.

Each of the first touch links 600 may be connected to one of the touch lines 520. For example, each of the touch lines 520 may be connected to the second end of one of the first touch links 600. The second interlayer insulating layer 242 may include a plurality of touch contact holes 520h exposing the second end of each first touch link 600.

Touch pads 105 may be disposed on the bezel area NA of the device substrate 100. The first end of each first touch link 600 may be electrically connected to one of the touch pads 105 by the one of second touch links 700. For example, each of the second touch links 700 may connect the first end of one of the first touch links 600 to the corresponding touch pad 105. The second touch links 700 may extend in a direction different from the first touch links 600. For example, the touch pads 105 may be disposed side by side with the display area AA in a second direction Y perpendicular to the first direction X, and the second touch links 700 may extend in the second direction Y. The second touch links 700 may cross a boundary between the display area AA and the bezel area NA in the second direction Y.

The second touch links 700 may be disposed on a layer different from the first touch links 600. For example, the second touch links 700 may be disposed on the same layer as the source electrode 250 and the drain electrode 260. The second touch links 700 may be disposed on the second interlayer insulating layer 242. The second touch links 700 may include the same material as the source electrode 250 and the drain electrode 260. The second interlayer insulating layer 242 may include a plurality of link contact holes 700h exposing the first end of each first touch link 600.

A touch passivation layer 150 may be disposed on the touch electrodes 510 and the touch lines 520. The touch passivation layer 150 may prevent the damage of the touch electrodes 510 and the touch lines 520 due to the external impact. The touch passivation layer 150 may include an insulating material. For example, the touch passivation layer 150 may include an organic insulating material, such as epoxy or acryl.

A crack preventing pattern 900 may be disposed on the bezel area NA of the device substrate 100. The crack preventing pattern 900 may prevent the occurrence of cracks due to the external impact. The crack preventing pattern 900 may have a multi-layer structure. For example, the crack preventing pattern 900 may have a stacked structure of a first preventing layer 910 and a second preventing layer 920. The touch passivation layer 150 may be disposed in a space defined by the crack preventing pattern 900. For example, the crack preventing pattern 900 may control the flow of the touch passivation layer 150.

Accordingly, the display apparatus according to the embodiment of the present disclosure may include the touch lines 520, the first touch links 600, the second touch links 700, wherein each of the touch line 520 is connected to the corresponding touch pad 105 by one of the first touch links 600 and one of the second touch links 700, and each of the first touch links 600 may be connected to the corresponding second touch link 700 in the display area AA. That is, in the display apparatus according to the embodiment of the present disclosure, each of the touch electrodes 510 may be connected to the corresponding touch pad 105 via the display area AA. Thus, in the display apparatus according to the embodiment of the present disclosure, the size of the bezel area NA occupied by the touch lines 520, the first touch links 600, and the second touch links 700 for connecting each touch electrode 510 to the corresponding touch pad 105 may be reduced or minimized. And, in the display apparatus according to the embodiment of the present disclosure, the touch lines 520 may not cross a spaced between the touch electrodes 510. Therefore, in the display apparatus according to the embodiment of the present invention, a space between the touch electrodes 510 may be reduced or minimized. Thereby, in the display apparatus according to the embodiment of the present disclosure, the reliability for the touch of the user or tool may be improved.

Figure 3A:
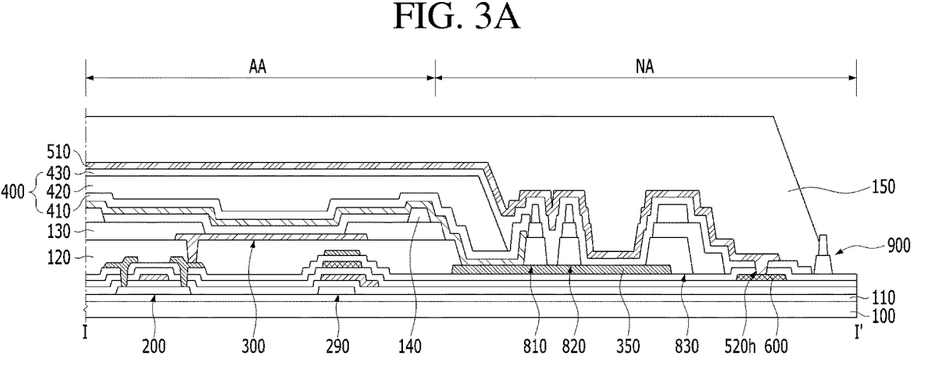
FIGS. 3A, 3B, 4A, 4B, 5A, and 5B are views respectively showing the display apparatus according to another embodiment of the present disclosure.
Figure 3B:
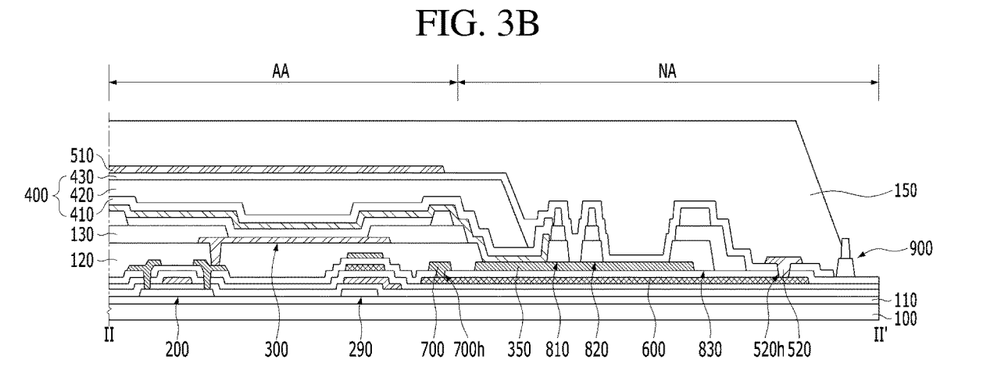

The display apparatus according to the embodiment of the present disclosure is described that each of the touch lines 520 may be connected to the corresponding first touch link 600 at the outside of the encapsulating element 400. However, in the display apparatus according to another embodiment of the present disclosure, the touch contact holes 520h exposing the second end of each first touch link 600 may penetrate the encapsulating element 400. For example, in the display apparatus according to another embodiment of the present disclosure, the third encapsulating layer 430 may be disposed closer to the crack preventing pattern 900 than the touch lines 520, as shown in FIGS. 3A and 3B. Thus, in the display apparatus according to another embodiment of the present disclosure, the degree of freedom for location of the touch contact holes 520h may be increased.

Figure 4A:
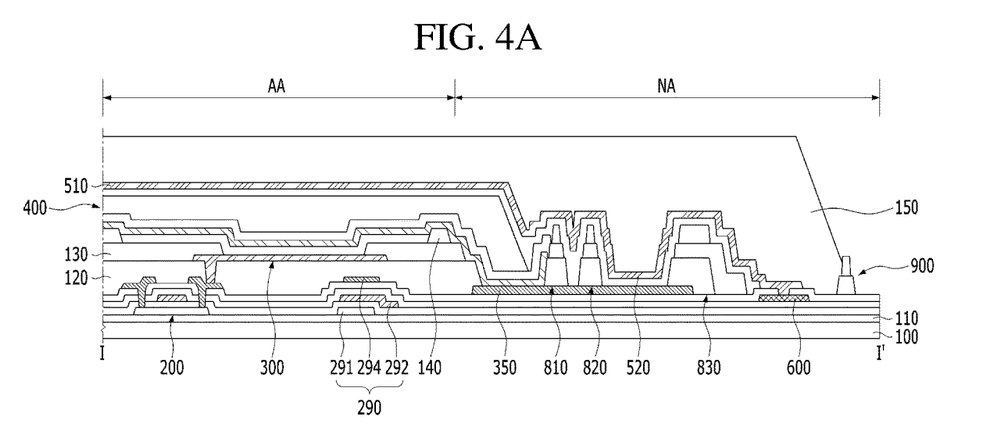
Figure 4B:
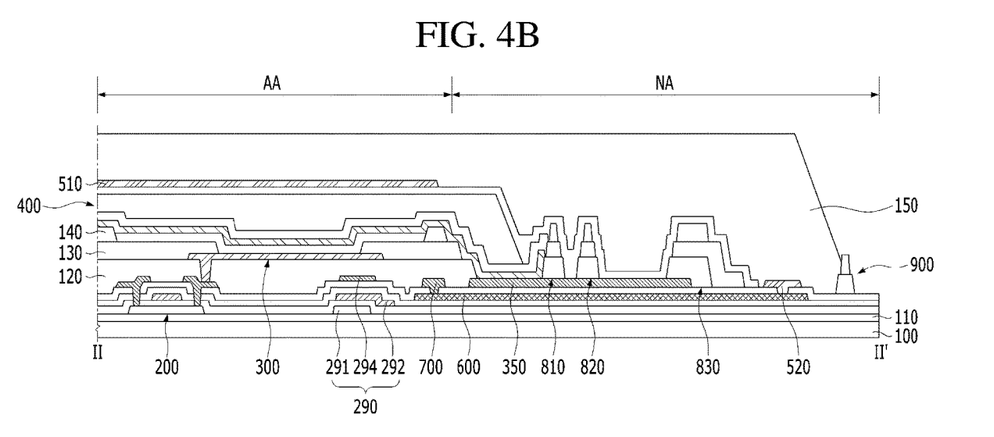

The display apparatus according to the embodiment of the present disclosure is described that the storage capacitor 290 may include the third storage electrode 293 which is disposed on the same layer as the first touch links 600. However, in the display apparatus according to another embodiment of the present disclosure, the storage capacitor 290 may be composed of the first storage electrode 291, the second storage electrode 292, and the fourth storage electrode 294, which are sequentially stacked on the buffer layer 110, as shown in FIGS. 4A and 4B. The gate insulating layer 220 may be disposed between the first storage electrode 291 and the second storage electrode 292. The first interlayer insulating layer 241 and the second interlayer insulating layer 242 may be disposed between the second storage electrode 292 and the fourth storage electrode 294. Thus, in the display apparatus according to another embodiment of the present disclosure, the size of the bezel area NA may be reduced, and the reliability for the touch of the user or tool may be improved, regardless of the characteristics of the thin film transistor 200 and the storage capacitor 290.

Figure 5A:
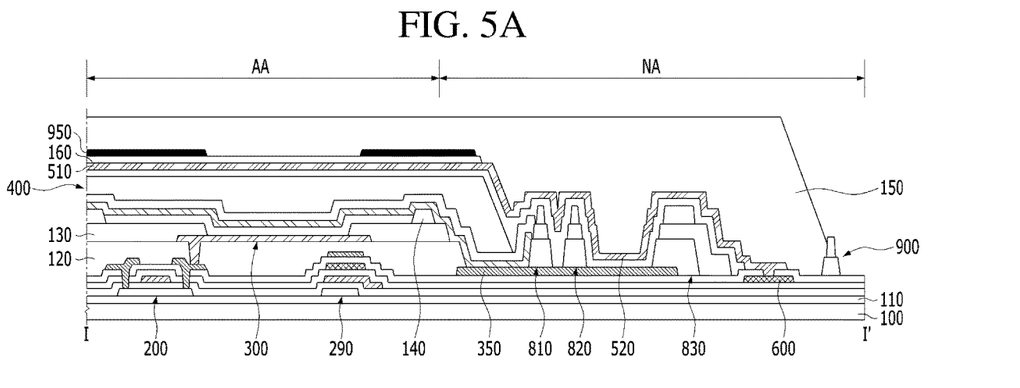
Figure 5B:
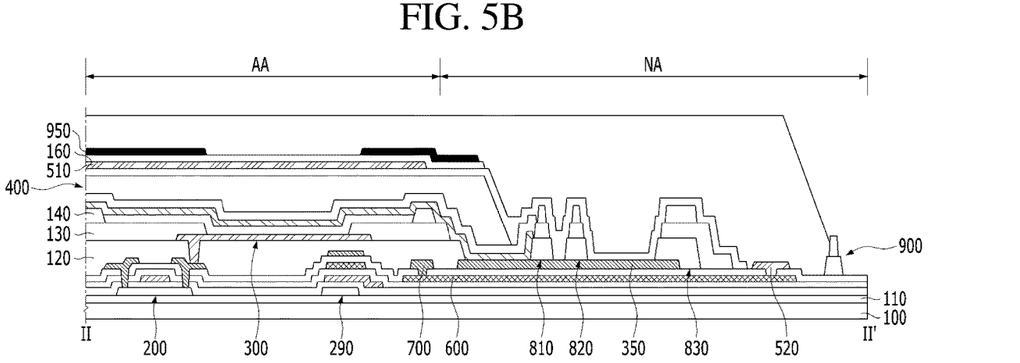

The display apparatus according to the embodiment of the present disclosure is described that the touch passivation layer 150 may be in direct contact with the touch electrodes 510 and the touch lines 520. However, in the display apparatus according to another embodiment of the present disclosure, a component for improving external light reflection and/or contrast ratio may be added between the touch electrodes 510 and the touch passivation layer 150. For example, in the display apparatus according to another embodiment of the present disclosure, a touch planarizing layer 160 covering the touch electrodes 510 may be disposed on the encapsulating element 400, and a black matrix 950 may be disposed on the touch planarizing layer 160, as shown in FIGS. 5A and 5B. The black matrix 950 may overlap the driving circuits. For example, the thin film transistor 200 and the storage capacitor 290 may overlap the black matrix 950. Thus, in the display apparatus according to another embodiment of the present disclosure, the space between the touch electrodes 510 may be reduced without deteriorating the quality of an image which is realized by the light-emitting devices 300.

In the result, the display apparatus according to the embodiments of the present disclosure may include the touch pads and the touch electrode connected to the touch pads by the touch lines, the first touch links and the second touch links, wherein each of the second touch links is connected to the corresponding first touch link in the display area. Thus, in the display apparatus according to the embodiments of the present disclosure, the size of a region occupied by the touch lines may be reduced. That is, in the display apparatus according to the embodiments of the present disclosure, the space between the touch electrodes may be reduced. Therefore, in the display apparatus according to the embodiments of the present disclosure, the reliability for the touch of the user or tool may be improved.

What is claimed is:

1. A display apparatus comprising:
   a light-emitting device on a display area of a device substrate;
   an encapsulating element covering the light-emitting device, the encapsulating element extending outside the display area;
   a touch electrode on the encapsulating element;
   a touch pad on the device substrate, the touch pad spaced from the encapsulating element;
   a touch line connected to the touch electrode, the touch line extending in an outer direction of the display area;
   a first touch link including a first end disposed in the display area and a second end disposed outside the display area; and
   a second touch link connecting the first end of the first touch link to the touch pad,
   wherein the touch line is disposed on a same layer as the touch electrode, and
   wherein the first end of the first touch link is directly connected to the second touch link, and the touch line is directly connected to the second end of the first touch link.

2. The display apparatus according to claim 1, wherein the touch line includes a same material as the touch electrode.

3. The display apparatus according to claim 1, further comprising an over-coat layer between the device substrate and the light-emitting device,
   wherein the first touch link includes a portion between the device substrate and the over-coat layer and the second touch link includes another portion between the device substrate and the over-coat layer.

4. The display apparatus according to claim 3, wherein the first end of the first touch link is disposed between the device substrate and the second touch link.

5. The display apparatus according to claim 3, further comprising a thin film transistor between the device substrate and the over-coat layer,
   wherein the thin film transistor includes a gate insulating layer on a semiconductor pattern, a gate electrode on the gate insulating layer, a first interlayer insulating layer on the gate electrode, a second interlayer insulating layer on the first interlayer insulating layer, a source electrode on the second interlayer insulating layer, and a drain electrode spaced away from the source electrode, and
   wherein the second touch link is disposed on the second interlayer insulating layer.

6. The display apparatus according to claim 5, wherein the second touch link includes a same material as the source electrode and the drain electrode.

7. The display apparatus according to claim 5, wherein the first touch link is disposed between the first interlayer insulating layer and the second interlayer insulating layer.

8. The display apparatus according to claim 1, wherein the encapsulating element includes a touch contact hole exposing the second end of the first touch link.

9. A display apparatus comprising:
   an encapsulating element on a device substrate;
   a touch electrode on the encapsulating element;
   a touch line connected to the touch electrode, the touch line extending in a first direction, and the touch line disposed on a same layer as the touch electrode;
   a first touch link extending in the first direction, the first touch link including a first end disposed in a display area of the device substrate and overlapping with the encapsulating element, and a second end disposed outside the display area and directly connected to the touch line; and
   a second touch link directly connected to the first end of the first touch link and connecting the first end of the first touch link to a touch pad, the second touch link extending in a second direction perpendicular to the first direction.

10. The display apparatus according to claim 9, wherein the second end of the first touch link is disposed outside the encapsulating element.

11. The display apparatus according to claim 9, wherein the touch line includes a same material as the touch electrode, and
   wherein the first touch link includes a portion between the device substrate and the encapsulating element and the second touch link includes another portion between the device substrate and the encapsulating element.

12. The display apparatus according to claim 11, wherein the second touch link includes a material different from the first touch link.

13. The display apparatus according to claim 11, the first end of the first touch link overlaps with the touch electrode.

* * * * *